Nov. 28, 1961 F. BARSON ET AL 3,010,855

SEMICONDUCTOR DEVICE MANUFACTURING

Filed Aug. 27, 1958

INVENTORS:
FRED BARSON
MILTON GENSER
BY
Alvin J. Riddles
ATTORNEY

United States Patent Office 3,010,855
Patented Nov. 28, 1961

3,010,855

SEMICONDUCTOR DEVICE MANUFACTURING

Fred Barson, Poughkeepsie, N.Y., and Milton Genser, Linden, N.J., assignors to International Business Machines Corporation, New York, N.Y., a corporation of New York Filed Aug. 27, 1958, Ser. No. 757,552
6 Claims. (Cl. 148—1.5)

This invention relates to semiconductor device manufacturing and, in particular, to the manufacturing of semiconductor devices having a region of graded resistivity.

In the fabrication of semiconductor devices, it has been found advantageous to provide a structure in connection with a semiconductor body wherein a region of graded resistivity is present having a value which is high in the portion adjacent to the original semiconductor body, decreasing to a value which is lower adjacent to a region of opposite conductivity type at the surface of the crystal.

This structure is then usable in a variety of semiconductor devices such as, for example, the "Drift" transistor well knownin the art wherein the region of graded resistivity is employed as the base region, the original semiconductor body serves as the collector region, and the recrystallized region is used as the emitter of the transistor. The techniques that have been employed heretofore in the art for the fabrication of this type of structure have been exceedingly complex, generally involving diffusion of impurities at high temperatures and have depended a great deal on the individual physical properties of both the semiconductor body and of the elements employed as donor and acceptor conductivity type determining impurities therein. In many instances physical properties such as vapor pressure of the elements employed have been such that certain elements have not been usable with certain semiconductor materials due to conflicts of the various physical properties.

A technique of semiconductor device manufacturing has been discovered wherein a number of physical properties of the materials involved, which in the past required close control, may now be relaxed as a result of a combination of the materials employed, and the process steps used in the fabrication technique.

One object of this invention is to provide a method of providing a rectifying connection associated with graded resistivity region in a semiconductor body.

Another object of this invention is to provide an improved process of providing an NP connection to a semiconductor body.

A related object is to provide a technique of relaxing the physical property requirements of the elements employed in an alloy and diffusion technique of semiconductor device manufacture.

Other objects of the invention will be pointed out in the following description and claims and illustrated in the accompanying drawings, which disclose, by way of example, the principle of the invention and the best mode, which has been contemplated, of applying that principle.

Figure 1:
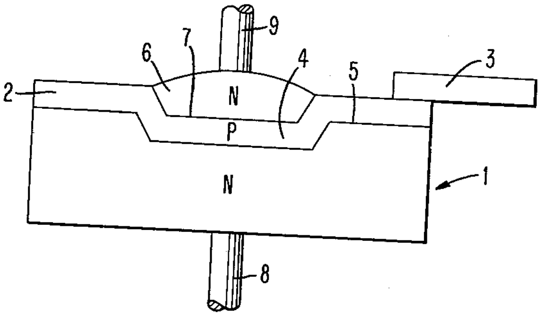
FIGURE 1 is an illustration of a transistor made by the technique of this invention.

Referring now to FIGURE 1, a transistor is illustrated having a body of semiconductor material such as germanium or silicon which for illustration purposes is indicated as having an N conductivity type. A region 2 of P conductivity type is shown occupying a portion of one surface of the body 1 and an ohmic base contact 3 is connected to the region 2. A region 4 of graded resistivity type indicated for illustration as P conductivity type penetrates into the N conductivity region of the body 1 forming a PN junction 5 therewith. A recrystallized N conductivity type region 6 forms a PN junction 7 with the conductivity type region.

Ohmic connections 8 and 9 are then made to the N conductivity type body 1 and to the N conductivity type recrystallized region 6, respectively.

The transistor of FIGURE 1 has the advantages of being provided with a very thin, graded resistivity, base region 4, which in the region adjacent to the junction 7 has a variation of resistivity from a value which is low at the emitter junction 7 to a value which is higher at the collector junction 5. The recrystallized emitter region 6 has a constant low value of resistivity which provides good injection efficiency commonly known in the art as gamma ($\gamma$).

The diffused collector junction 5, on the other hand, has a gradient such that the field associated with the junction is spread over a sufficiently wide region that the magnitude of fields at the junction are not built up to cause avalanche breakdown and consequently, this transistor is capable of handling large collector voltages.

Another advantage of the structure lies in the broad area P region 2 made on the surface of the transistor to which the base tab 3 is attached. This provides a large connection to the very thin base region 4 so that the high frequency response associated with thin base regions is not accompanied by large base spreading resistances in this type of structure.

It will be apparent to one skilled in the art that the structure of FIGURE 1 may be provided with what is known in the art as a "hook" collector by replacing the ohmic contact 8 with another junction, such as introducing by diffusing, P conductivity type determining impurities.

Semiconductor devices constructed along the lines of FIGURE 1 in accordance with the invention may be provided by the process illustrated in connection with the flow chart of FIGURE 2, wherein in a first step a semiconductor body is provided having both N conductivity type and P conductivity impurities in the crystal. Such a body is known in the art as a double doped semiconductor body and, the body provided for use in this invention is known as compensated material, with the compensation such that the donor impurities predominate over the acceptor impurities so that the body exhibits N conductivity type extrinsic conductivity. The body which, for example, may be germanium or silicon or any of the intermetallic compounds, may be fabricated in a variety of ways such as by the crystal growing technique wherein the melt is "doped" with selected quantities of impurities of the desired type during the growing operation or by diffusion techniques well known in the art. A region 2 of opposite conductivity type, indicated for example as P type, is provided in the body 1, to a shallow depth such as by diffusion to provide a broad area connected to a graded resistivity region to be later provided.

In a second step, on one surface of the semiconductor body, a quantity of a solvent metal is placed in contact with the body, the solvent metal being any metal; for example lead, which is capable of forming an alloy with the particular semiconductor material at a temperature below the melting temperature of the semiconductor material so that portions of the semiconductor material will be dissolved in the metal when melted. Heat is then applied until the solvent metal fuses and dissolves a portion of the semiconductor material.

Since N conductivity type determining, or "donor" impurities, are characterized by the fact that they have higher diffusion coefficients than P conductivity type determining or "acceptor" impurities, the solvent metal, in the molten state, operates to act as a "sink" for the "donor" impurities, which, having received increased mobility as a result of the heat, now diffuse out of the semiconductor crystal and into the molten pool of the alloy of semiconductor material and solvent metal. Since the initial crystal was double doped; that is, contained both "donor" (N conductivity type determining) and "acceptor" (P conductivity type determining) impurities, the initial predominance of N conductivity type impurities, once they have migrated into the molten pool, will no longer be maintained and the resulting region from which they have diffused will then have "acceptor" or P conductivity type impurities predominating and a P region joined to the N region by a PN junction will result. It will be appreciated that a thin recrystallized region may be provided by slightly lowering the temperature at this point until some freezing occurs so that the impurity distribution produced by diffusion in the solid and resistance to the effects of temperature fluctuation may be gained.

Figure 2:
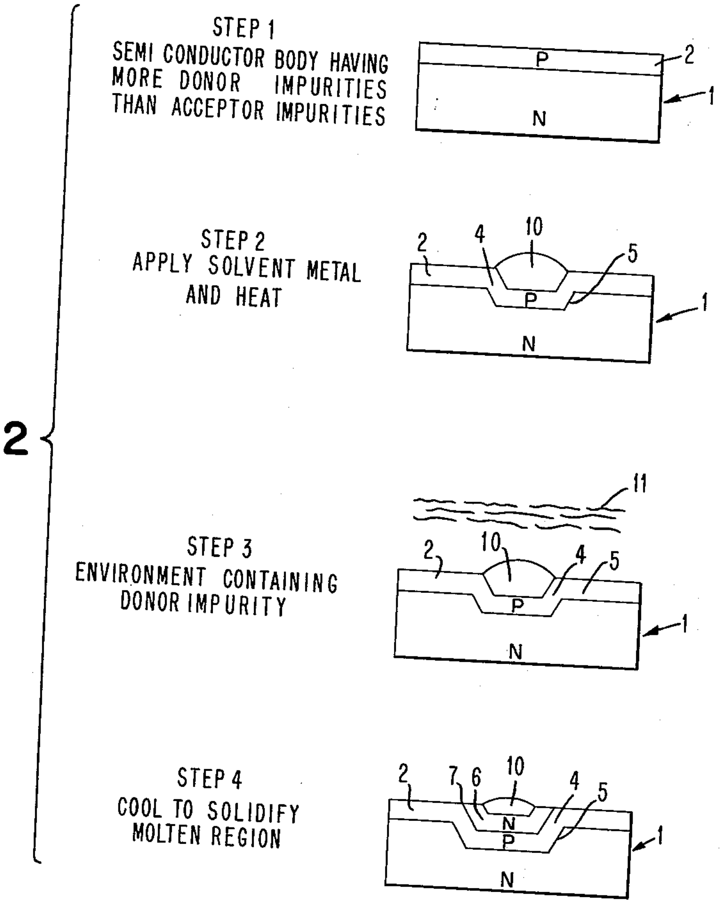
FIGURE 2 is an illustrated flow chart showing the steps involved in the process of the invention.

In the portion of the structure associated with the figure illustrating step 2 of FIGURE 2, the body 1 shown as N conductivity type is joined at a junction 5 to the P region 4 formed as a result of the diffusion. The region 4 is, in turn, connected to the thin, already present, broad area P type skin 2. The molten pool of solvent metal and semiconductor material is shown by the numeral 10.

In a third step, the semiconductor body, while the heat is maintained sufficiently to keep the pool 10 in a molten condition, is subjected to an environment containing a donor impurity. The environment is in the form of a vapor 11 having a donor impurity such as arsenic suspended in it in sufficient quantity that the arsenic from the vapor is absorbed by the molten material 10 until the donor impurity is present in the molten material 10, in a concentration such that, multiplied by the segregation coefficient of the particular donor impurity introduced from the vapor, will override the concentration multiplied by the segregation coefficient, of any acceptor impurity present in the molten zone. The semiconductor body is now cooled to solidify the molten region, and in the cooling, as the molten zone solidifies, a portion of the semiconductor material recrystallizes out with the same periodicity of crystal structure present in the original crystal and sufficietn "donor" impurities now segregate out into the recrystallized region so that an N conductivity type region is formed, indicated by the numeral 6 forming a PN junction 7 with the P conductivity type region. The remainder of the molten pool 10, when solidified may serve as an ohmic connection to the N conductivity type recrystallized region.

A certain amount of liberty has been taken with the scale in FIGURE 1 in order to provide a better illustration and in the interest of establishing a proper perspective. Let us consider, for example, the following set of specifications. The body in FIGURE 1 may be a single crystal of, for example, germanium, silicon or an intermetallic compound semiconductor material, and as a particular example, germanium is taken. The crystal may be approximately 0.020 inch square having a thickness from the exposed surface of the region 2 to the ohmic contact 8 on the order of 0.0005 inch. The region 2 may be 0.0002 inch thick. The solvent metal may be a sphere of lead 0.005 inch in diameter. The crystal 1 may contain approximately 0.00002% arsenic and 0.00001% indium exhibiting N type extrinsic conductivity of about 2 ohm centimeters. The combination is heated to 750° C. for two hours to permit the N conductivity type impurities to diffuse into the molten region 10. An environment 11 of arsenic, in a concentration of approximately $10^{16}$ atoms per cubic centimeter is exposed for a few minutes to the surface of the crystal 1 while a temperature sufficient to keep the region 10 molten is maintained. The crystal 1 is then cooled to room temperature.

The structure of step 4 of FIGURE 2 may be fabricated into the transistor of FIGURE 1 by the application of ohmic contacts 3, 8 and 9 employing techniques well known in the art.

What has been described is a technique of producing a rectifying connection and a transistor employing the connection wherein a region of graded resistivity is provided joining a recrystallized region of opposite conductivity type in a semiconductor crystal in a single temperature cycling step and wherein the behavior of many of the impurities employed is determined by their behavior in the crystal or the solvent metal rather than by their behavior in the environment.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A process of providing a rectifying connection to a body of semiconductor material comprising the steps of providing a body of semiconductor material having both "donor" impurities and "acceptor" impurities included therein in a concentration such that the donor impurities predominate in the semiconductor body, placing a quantity of a solvent metal in contact with said body, said solvent metal having a conductivity type determining relationship with said donor and acceptor impurities so as not to retard a subsequent out diffusion of said donor impurity out of said body, heating said body and said solvent metal on the surface of said body to form a molten pool, maintaining said body and said molten pool at a temperature and for a time sufficient to effect a diffusion of donor impurities out of said body adjacent said molten pool, forming thereby a graded resistivity region of P conductivity type in said body, exposing the molten pool of said solvent metal on the surface of said body to an environment containing a donor impurity and cooling said body to solidify said molten region forming thereby an N conductivity type recrystallized region forming an abrupt PN junction with said P conductivity type region.

2. The method of fabricating a semiconductor device comprising providing a semiconductor body having a predominance of donor impurities along with a quantity of acceptor impurities therein, heating a solvent metal in contact with said body to form a molten pool on the surface thereof, said solvent metal having a conductivity type determining relationship with said donor and acceptor impurities so as not to retard a subsequent out diffusion of said donor impurity out of said body, thereby effecting diffusion of donor impurity out of the region adjacent the interface of said molten pool and said body, and forming thereby a graded resistivity region of P conductivity type introducing from a vapor into said molten pool a quantity of donor impurity in a concentration such that multiplied by the segregation coefficient of said donor impurity will result in a predominance of donor impurity in a recrystallized region of said semiconductor body and thereafter cooling said semiconductor body to solidify said molten pool and form a recrystallized region in said semiconductor body.

3. The method of making a semiconductor device comprising providing an N conductivity type semiconductor body of compensated semiconductor material having a predominance of donor impurities, diffusing said donor impurities in the presence of heat into a molten pool of a solvent metal on the surface of said semiconductor body, said solvent metal having a conductivity type determining relationship with said donor and acceptor impurities so as not to retard a subsequent out diffusion of said donor impurity out of said body, thereby forming a graded resistivity P conductivity type region in said body adjacent said molten pool, introducing from a vapor a quantity of donor impurities into said molten pool, and thereafter cooling said semiconductor body to solidify said molten pool thereby forming an N conductivity type recrystallized region in said body forming an abrupt PN junction with said P conductivity type region.

4. The method of fabricating a transistor comprising the steps of providing a semiconductor body of N conductivity type extrinsic conductivity semiconductor material said body being of compensated semiconductor material having a predominance of donor impurities over acceptor impurities therein, diffusing into a thin skin layer on one surface thereof P conductivity type determining impurities so as to provide a thin surface region on said semiconductor body of P conductivity type, placing a quantity of a solvent metal on said P conductivity type surface of said semiconductor body, said solvent metal having a conductivity type determining relationship with said donor and acceptor impurities so as not to retard a subsequent out diffusion of said donor impurity out of said body, heating said semiconductor body and said solvent metal to form a molten pool on the surface of said P conductivity type skin on said semiconductor body, maintaining said semiconductor body at a temperature sufficient to keep said solvent metal in a molten condition thereby effecting a diffusion of donor impurities out of said semiconductor body and into said molten pool resulting in the formation of a graded resistivity P conductivity type region in said body adjacent said molten pool, exposing said molten pool to a vapor containing a donor impurity in a concentration such that the concentration of said donor impurity when absorbed in said molten pool multiplied by the segregation coefficient of said donor impurity will result in a predominance of said donor impurity in a recrystallized region, cooling said semiconductor body to solidify said molten pool and thereby to produce in said semiconductor body an N conductivity type recrystallized region and applying ohmic contacts to the metal solidified from said molten pool, to said P type skin and to said original N type body.

5. The method of making a semiconductor device comprising the steps of providing an N conductivity type semiconductor body containing a quantity of indium conductivity type determining impurity and a greater quantity of arsenic conductivity type determining impurity, applying a quantity of lead to one surface of said semiconductor body, said lead having a conductivity type determining impurity concentration therein sufficiently low as not to retard a subsequent out diffusion of said arsenic into said lead, heating said semiconductor body to fuse said lead to said semiconductor body forming thereby a molten pool, maintaining said body and said molten pool at a temperature and for a time sufficient to effect a diffusion of said arsenic out of said body adjacent said pool thereby forming a graded resistivity P conductivity type region in said semiconductor body, exposing a vapor containing arsenic to said molten lead on said semiconductor body for a time sufficient to permit a quantity of arsenic to be absorbed in said molten pool and cooling said semiconductor body to solidify said molten pool and thereby to form an N conductivity type recrystallized region in said semiconductor body forming an abrupt PN junction with said P conductivity type region.

6. A method of making a transistor comprising the steps of providing a body of germanium semiconductor material having a quantity of indium conductivity type determining impurity and a greater quantity of arsenic conductivity type determining impurity therein imparting thereby N conductivity type to said semiconductor body, diffusing into one surface of said body a quantity of indium conductivity type determining impurities providing thereby a thin skin of P conductivity type semiconductor material on said N conductivity type body, placing a quantity of lead in contact with said P conductivity type skin, said lead having a conductivity type determining impurity concentration sufficiently low so as not to retard a subsequent out diffusion of said arsenic into said lead, heating said semiconductor body to fuse said lead into a molten pool on said P type surface of said semiconductor body, maintaining said heat for a period of time sufficient to effect a diffusion of said arsenic donor impurities adjacent to the interface of said molten pool and said semiconductor body into said molten pool forming thereby a region of P conductivity type in said semiconductor body having a gradient of resistivity therein, exposing in the presence of heat said molten pool to a vapor containing arsenic resulting in an arsenic concentration in said molten pool such that when multiplied by the segregation coefficient of arsenic will be such as to provide a predominance of said arsenic conductivity determining impurity in a recrystallized region to be later formed, cooling said semiconductor body to solidify said molten pool and to form an N conductivity type recrystallized region and providing ohmic connections to said original N type semiconductor body, to the surface of said P type semiconductor body skin and to the metal solidified from said molten pool.

References Cited in the file of this patent

UNITED STATES PATENTS

| | | |
|---|---|---|
| 2,739,088 | Pfann | Mar. 20, 1956 |
| 2,789,068 | Maserjian | Apr. 16, 1957 |
| 2,829,993 | Myer et al. | Apr. 8, 1958 |
| 2,835,613 | Haayman | May 20, 1958 |
| 2,836,523 | Fuller | May 21, 1958 |
| 2,898,247 | Hunter | Aug. 4, 1959 |